United States Patent [19]

Morgan et al.

[11] Patent Number: 5,329,587

[45] Date of Patent: Jul. 12, 1994

[54] LOW-DELAY SUBBAND ADAPTIVE FILTER

[75] Inventors: Dennis R. Morgan, Morristown, N.J.; James C. H. Thi, Gaithersburg, Md.

[73] Assignee: AT&T Bell Laboratories, Murray Hill, N.J.

[21] Appl. No.: 30,931

[22] Filed: Mar. 12, 1993

[51] Int. Cl.$^5$ ............................................. H04M 1/00
[52] U.S. Cl. .................................. 379/410; 379/406; 379/407; 379/411; 370/32.1
[58] Field of Search ............... 379/406, 407, 410, 411, 379/345, 391, 392; 370/32, 32.1

[56] References Cited

U.S. PATENT DOCUMENTS

| | | | |
|---|---|---|---|
| 4,807,173 | 2/1989 | Sommen et al. | 364/724.18 |
| 4,903,247 | 2/1990 | Gerwen et al. | 367/135 |
| 4,956,838 | 9/1990 | Gilloire et al. | 370/32.1 |
| 4,977,591 | 12/1990 | Chen et al. | 379/40 |
| 5,001,701 | 3/1991 | Gay | 379/406 X |

FOREIGN PATENT DOCUMENTS

2240452 7/1991 United Kingdom ............... 370/32.1

OTHER PUBLICATIONS

J. J. Shynk. "Frequency-domain and multirate adaptive filtering," IEEE Signal Processing Magazine, vol. 9, pp. 14-37, Jan. 1992.

M. M. Sondhi and W. Kellermann, "Adaptive echo cancellation for speech signals," in Advances in Speech Signal Processing, S. Furui and M. M. Spndhi, Eds., New York: Marcel Dekker, 1992.

D. R. Morgan, "An Analysis of multiple correlation cancellation loops with a filter in the auxiliary path," IEEE Trans. Acoust. Speech, Signal Processing, vol. ASSP-28, pp. 454-467, Aug. 1980.

J. C. Burgess, "Active sound control in a duct: A computer simulation," J. Acoust. Soc. Am., vol. 70, pp. 715-726, Sep. 1981.

B. Widrow et al., "On adaptive inverse control," in Proc. 15th Asilomar Conf. Circuits, Systems, Computers, 1981, pp. 185-189.

M. Xu et al, "Time-frequency domain adaptive filter," in Proc. IEEE Int. Conf. Acoust., Speech, Signal Processing, 1989, 1154-1157.

J. M. P. Borallo et al., "On the implementation of a partitioned block frequency domain adaptive filter (PREDAF) for long acoustic echo cancellation," Signal Processing, vol. 27, pp. 301-315, Jun. 1992.

(List continued on next page.)

Primary Examiner—James L. Dwyer
Assistant Examiner—Paul A. Fournier
Attorney, Agent, or Firm—Kenneth M. Brown

[57] ABSTRACT

A subband adaptive filter is disclosed that retains the computational and convergence speed advantages of subband processing while eliminating delay in the signal path. The technique has applications in active noise control where delay seriously limits cancellation performance and in acoustic echo cancellation where transmission delay specifications may limit the use of conventional subband designs. A reference signal and a residual error signal are each decomposed into a plurality of subband signals, and a set of adaptive weighting coefficients is generated for each of these subbands by a conventional complex LMS (least-mean-squared) technique. These sets of subband weighting coefficients are then transformed into the frequency domain, appropriately stacked and inverse transformed back into the time domain to obtain wideband filter coefficients for a programmable filter. The reference signal, which is correlated with the disturbance signal to be eliminated, is filtered by this programmable filter to produce a disturbance estimate signal which may be subtracted from the signal containing the disturbance. The process iterates in order to minimize the residual error signal and thereby reduce the disturbance.

18 Claims, 6 Drawing Sheets

OTHER PUBLICATIONS

P. Darlington et al., "Synchronous adaptive filters with delayed coefficient adaption," in Proc. IEEE Int. Conf. Acoust., Speech Signal Processing, 1988, pp. 2586-2589.

G. Long, et al., "The LMS algorithm with delayed coefficient adaptation," IEEE Trans. Acoust. Speech, Signal Processing, vol. ASSP-37, pp. 1397-1405, Sep. 1989.

R. Haimi-Cohen et al., "Delayed adaptive LMS filtering: current results," in Proc. IEEE Int. Conf. Acoust., Speech, Signal Processing 1990, 1273-1276.

G. Long et al., "Correction to 'The LMS algorithm with delayed coefficient adaptation'," IEEE Trans. Acoust. Speech, Signal Processing vol. 40, 230-232, Jan. 1992.

D. R. Morgan et al., "A control theory approach to the stability and transient analysis of the filtered-x LMS adaptive notch filter," IEEE Trans. Signal Processing, vol. 40, pp. 2341-2346, Sep. 1992.

E. R. Ferrara, Jr., "Frequency-domain adaptive filtering," in Adaptive Filters, C. F. N. Cowan and P. M. Grant, Eds., Englewood Cliffs, NJ: Prentice-Hall, 1985, ch 6, pp. 145-179.

D. A. Berkley et al., "HuMaNet: an experimental human-machine communications network based on ISDY wideband audio," AT&T Tech. J., vol. 69, pp. 87-99, Sep./Oct. 1990.

D. R. Morgan et al., "A Multitone Pseudocascade Filtered-X LMS Adaptive Notch Filter," IEEE Trans. Signal Processing, vol. 41, No. 2, Feb. 1993, pp. 946-956.

LOW-DELAY SUBBAND ADAPTIVE FILTER

FIELD OF THE INVENTION

The present invention relates generally to the field of adaptive filtering techniques and specifically to the use of such techniques for adaptive noise cancellation.

BACKGROUND OF THE INVENTION

Adaptive filtering techniques are now in widespread use for a number of applications such as adaptive arrays, adaptive line enhancement, adaptive modeling and system identification, adaptive equalization, and adaptive noise cancellation, including acoustic echo cancellation and active noise control.

In particular, the adaptive noise cancellation problem typically involves the generation of a signal which reflects an estimate of a disturbance (i.e., noise) which is to be reduced or eliminated (i.e., cancelled) from a primary source signal. Once determined, this estimate signal may then be subtracted from this primary source signal to reduce the effect of the disturbance. Active noise control in particular involves the generation of a secondary signal (e.g., sound) for the purpose of counteracting the effect of a preexisting noise disturbance. Adaptive filtering techniques are advantageously employed in the context of adaptive noise cancellation because a source signal from which a disturbance has been partially removed may be iteratively tested and processed to further reduce (e.g., minimize) the presence of the disturbance.

Certain adaptive filtering applications involve adaptive filter lengths with hundreds of taps. Examples of such applications include wideband active noise control for complex mechanical structures and acoustic echo cancellation, both of which are characterized by long impulse responses. The computational burden associated with these long adaptive filters precludes their use for many low-cost applications. In addition to computational complexity, adaptive filters with many taps may also suffer from long convergence times, especially if the reference signal spectrum has a large dynamic range.

A technique that involves the use of subbands has been recently exploited to address the above problems. Processing the signals in subbands has a twofold advantage. First, the computational burden is reduced by approximately the number of subbands, since both the tap length and weight update rate can be decimated in each subband. Second, faster convergence is possible because the spectral dynamic range within each subband is greatly reduced as compared to the overall spectral range.

One disadvantage of existing subband adaptive filters, however, is that a delay is necessitated by virtue of the bandpass filters used to derive subband signals. This delay presents a problem for some applications. In active noise control applications, for example, delay seriously limits the bandwidth over which good cancellation can be achieved. For acoustic echo cancellation applications, some transmission systems mandate a very low signal path delay. Thus, conventional subband adaptive filtering techniques may be precluded for applications requiring low delay.

SUMMARY OF THE INVENTION

A technique is provided for generating a disturbance estimate signal for use in, for example, adaptive noise cancellation. According to an illustrative embodiment of the invention, a signal reflecting reference information is filtered by a plurality of subband filters to produce a plurality of subband reference signals. A signal reflecting a disturbance is filtered by a corresponding plurality of subband filters to produce a plurality of subband disturbance reflecting signals. Then, a plurality of sets of time domain subband weighting coefficients are generated, each set being derived based on a corresponding subband reference signal and a corresponding subband disturbance reflecting signal. Each set of time domain subband weighting coefficients is transformed into a set of frequency domain subband weighting coefficients. The frequency domain subband weighting coefficients are combined into a combined set of frequency domain weighting coefficients. The coefficients of this combined set are then transformed back into the time domain. This resultant set of combined time domain weighting coefficients is then supplied to a programmable filter which filters the reference signal accordingly in order to produce the disturbance estimate signal.

DETAILED DESCRIPTION

Figure 1:
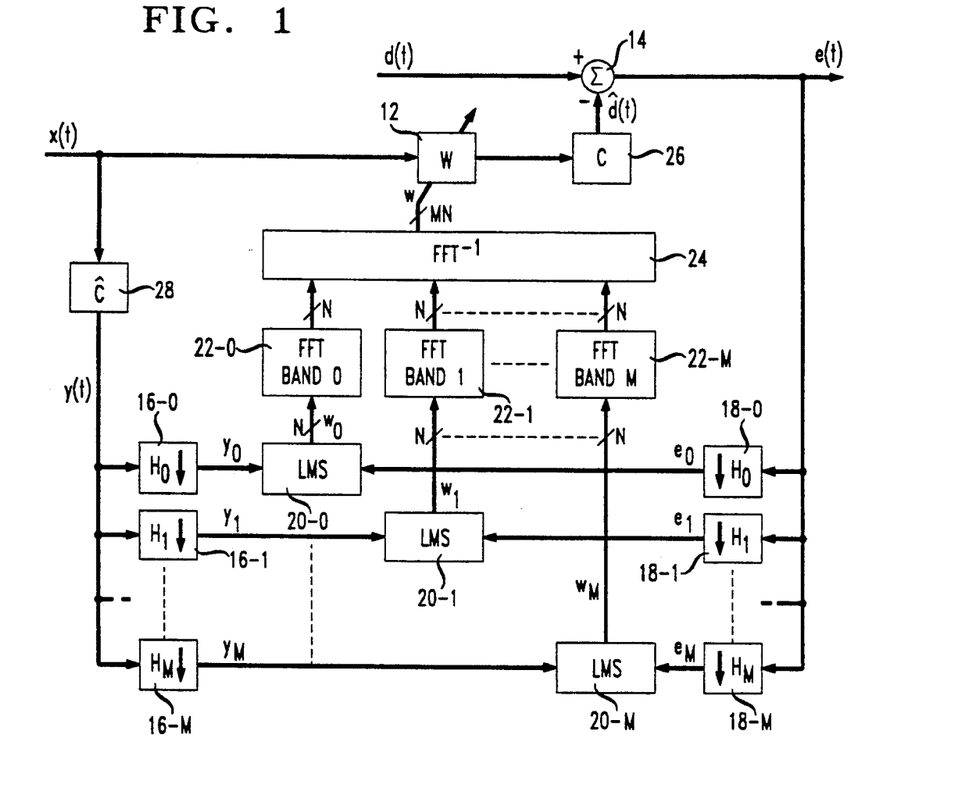
FIG. 1 shows a block diagram of a low-delay subband adaptive filter according to a first embodiment of the present invention.

FIG. 1 shows a block diagram of a low-delay subband adaptive filter for use in adaptive noise cancellation according to a first embodiment of the present invention. A disturbance signal d(t) reflects a disturbance to be reduced or eliminated. The reference signal x(t) is a signal reflecting reference information which is correlated with the disturbance to be reduced. For example, in an acoustic echo cancellation application it may be desirable to cancel certain components of a microphone's output signal. These components may be generated as a result of the microphone's proximity to a loudspeaker. Such an application is presented by a conventional speakerphone. In such a case, d(t) may represent the microphone's output signal (which includes a disturbance) and x(t) may represent the loudspeaker's input signal (upon which the disturbance is based). Note that signal d(t) may or may not include that part of a source signal which is not part of a disturbance. The embodiment of the present invention will remove from the microphone output signal those portions of the signal which are correlated with the disturbance. (See the discussion of FIG. 2 below.)

According to the first embodiment, reference signal x(t) is filtered by programmable filter 12 having a transfer function W. This transfer function is derived iteratively, and is based on a set of MN (i.e., M times N) weights (or coefficients), w, supplied by inverse FFT processor 24. The resulting filtered signal, which reflects an estimate of the disturbance signal, is filtered in turn by cancellation path filter 26 (having a transfer function C). The result is a disturbance estimate signal $\hat{d}(t)$. Disturbance estimate signal $\hat{d}(t)$, like the signal output from programmable filter 12, reflects an estimate of the disturbance to be removed from disturbance signal d(t). Removal of $\hat{d}(t)$ from d(t) is accomplished by summation 14.

Illustratively, cancellation path filter 26 may represent an inherent transfer function applied by the environment to the signal generated by programmable filter 12. In an active noise control application, for example, it may be desired to create a "zone of silence" in a particular physical location by producing sound from a loudspeaker which will cancel the effect of a given preexisting disturbance. In this case, transfer function C of cancellation path filter 26 may reflect the effect on the loudspeakers input signal by the loudspeaker itself, as well as the effect of air (or other medium through which the sound may travel) between the loudspeaker and the intended "zone of silence." In other words, even though the active noise control system may generate a given signal to be provided to a loudspeaker (i.e., the output of programmable filter 12), the actual cancellation result achieved will be based on the generated signal as "filtered" by the effects of the loudspeaker and the air. Thus, C represents the electroacoustic (or electromechanical) transfer function from the input of the loudspeaker to the location of the intended zone of silence. In other cases, such as in the acoustic echo cancellation application described above, them may be no cancellation path filter 26, since direct access to summation 14 is available. That is, the output signal of programmable filter 12 may be directly subtracted from disturbance signal d(t) by an electrical implementation of summation 14.

Summation 14 removes the disturbance estimate from the disturbance signal by subtracting signal $\hat{d}(t)$ from signal d(t) to produce residual error signal e(t). Thus, residual error signal e(t) is based on disturbance signal d(t). Since signal d(t) reflects a disturbance, signal e(t) is therefore also a signal which reflects a disturbance. The operation of summation 14 may be effectuated by the physical environment (as in the active noise control case) or by an electrical component (as in the acoustic echo cancellation case). Note that residual error signal e(t) may or may not include a desirable part of a source signal which is not part of a disturbance (depending on whether disturbance signal d(t) does or does not include the desirable part of a source signal). However, that portion of residual error signal e(t) which is part of a disturbance represents the actual residual disturbance (residual error) which is to be reduced (minimized). In other words, the actual residual error is the remaining portion of e(t) which is correlated with the disturbance signal (and thus with reference signal x(t)). The operation of the illustrative embodiments involves an iterative adjustment of the coefficients w of programmable filter 12 such that the mean square residual error is reduced.

The technique used for adapting the coefficients of programmable filter 12 employs a conventional modification of the complex LMS (least-mean-squared) process well known in the art. The modification compensates for the effect of cancellation path transfer function C by initially filtering reference signal x(t) by cancellation path estimate filter 28 to produce filtered reference signal y(t). Filtered reference signal y(t), like reference signal x(t), reflects reference information which is correlated with the disturbance. Cancellation path estimate filter 28 has a transfer function which is an estimate of transfer function $\hat{C}$ of cancellation path filter 26. In this manner, the choice of coefficients to be applied by programmable filter 12 will appropriately compensate for the effect of cancellation path filter 26. This technique is commonly known in the art as the "filtered-x" LMS (or FXLMS) process. Of course, in the case where there is no cancellation path filter 26 (e.g., in the acoustic echo cancellation case) them will also be no need for cancellation path estimate filter 28. In such a case, both transfer functions C and $\hat{C}$ may be viewed as equalling one (the identity function).

According to the embodiment of the present invention, filtered reference signal y(t) is decomposed into a set of subband reference signals $y_0, y_1 \ldots$ and $y_M$ by the application of a set of M+1 single-sideband bandpass filters. These bandpass filters, subband filters 16-0, 16-1 . . . and 16-M (hereafter subband filters 16-m) have transfer functions $H_0, H_1, \ldots$ and $H_M$, respectively. Similarly, residual error signal e(t) is decomposed into a set of subband residual error signals $e_0, e_1, \ldots$ and $e_M$ by the application of a corresponding set of M+1 single-sideband bandpass filters. These bandpass filters, subband filters 18-0, 18-1, . . . and 18-M (hereafter subband filters 18-m), also have (identical) transfer functions $H_0, H_1, \ldots$ and $H_M$, respectively. These subband filters span the frequency range from zero to the sampling rate. In each subband, both the subband reference signals and the subband residual error signals are appropriately decimated (i.e., downsampled) by subband filters 16-m and 18-m, respectively, to reflect the reduced frequency range. Such downsampling is conventional in subband processing techniques. Illustratively, M may be 32.

Figure 2:
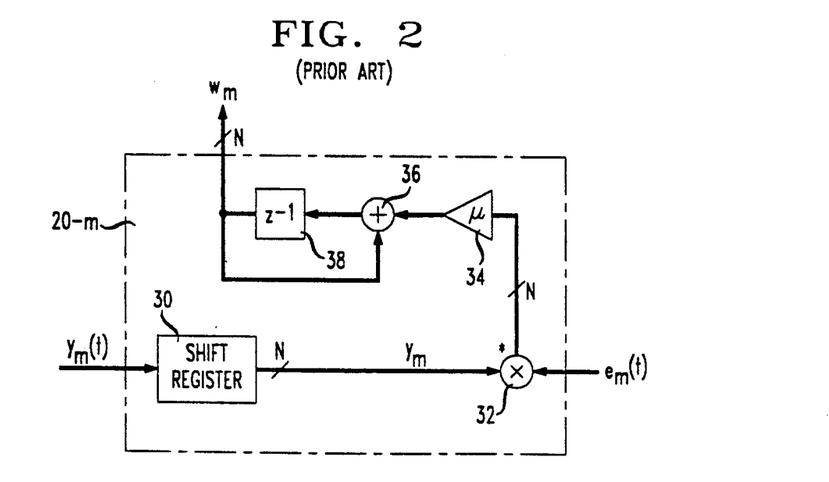
FIG. 2 shows a block diagram of each conventional LMS processor of the system of FIG. 1.

Once signals y(t) and e(t) have been decomposed into sets of corresponding subband signals, a set of N adaptive weights (i.e., filter coefficients) is computed for each subband individually. As described above, a conventional complex LMS process is used, implemented by LMS processors 20-0, 20-1, . . . and 20-M (hereafter LMS processors 20-m), respectively. In particular, LMS processor 20-0 generates a set $w_0$ comprising N coefficients, LMS processor 20-1 generates a set $w_1$ comprising N coefficients, . . . and LMS processor 20-M generates a set $w_M$ comprising N coefficients. The detailed function of each LMS processor is illustrated in FIG. 2, and discussed below. Illustratively, N may be 32.

After each LMS processor 20-m has generated adaptive weights $w_0, w_1, \ldots w_M$ (hereafter $w_m$), respectively, for each subband, these sets of coefficients are then transformed into the frequency domain by FFT processors 22-0, 22-1, . . . and 22-M (hereafter FFT processor 22-m), respectively. Specifically, each FFT processor 22-m produces a set of N frequency domain coefficients. These FFT processors may be implemented by conventional fast fourier transformation techniques.

Figure 7:
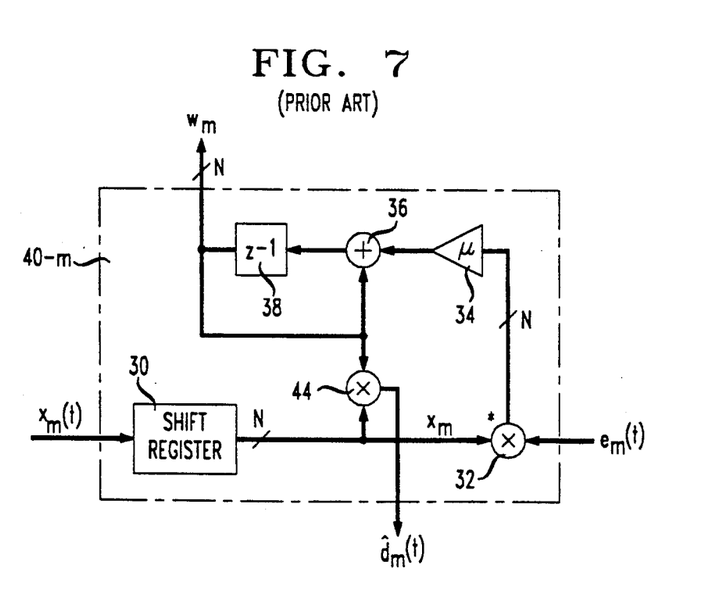
FIG. 7 shows a block diagram of each conventional LMS processor of the system of FIG. 6.

Next, the M+1 sets of frequency domain coefficients are appropriately stacked and inverse transformed by inverse FFT processor 24 to obtain the (time domain) filter coefficients w for programmable filter 12 (i.e., the coefficients of the transfer function W). Inverse FFT processor 24 may be implemented by a conventional inverse fast fourier transformation technique. An illustrative example of frequency stacking is illustrated in FIG. 7 and described below. Note that because the (wideband) filter coefficients are real, only half of the sampling band is actually processed, corresponding to the positive frequency components of the wideband filter response. The other half of the response is formed in complex conjugate symmetry.

The FFTs and the inverse FFT need not be performed at the decimated sample rate. A substantial reduction in computation can be realized if they are computed only once every several decimated samples, with a corresponding moderate time lag in convergence. It is further noted that the wideband filter convolution can be more efficiently computed either by using a vector coprocessor or by using orthogonal transform techniques. A vector coprocessor is a conventional specialized hardware device that is dedicated to fast convolution. Alternatively, fast convolution can be realized using conventional orthogonal transform techniques such as the FFT. However, some care must be taken to insure that no delay is introduced into the signal path. Usually, a fast FFT convolution will entail a block delay in throughput. However, this can be avoided by splitting the wideband filter coefficients into segments of equal length. Then processing with the first segment may be implemented by direct convolution while the remaining segments may be processed by fast convolutions in time sequence. In this way, the fast convolution part may be started ahead of time by the number of samples in the direct convolution so that the output is available when needed. Thus, the total number of computations for the wideband convolution may be reduced by approximately the number of segments (neglecting the fast part of the computation).

FIG. 2 illustrates the detailed operation of each conventional LMS processor 20-m. Each LMS processor takes as input a corresponding subband reference signal $y_m(t)$ and a corresponding subband residual error signal $e_m(t)$, and produces a set $w_m$ of N adaptive weights (coefficients) for the given subband. Note that except for shift register 30, each of the illustrated devices in FIG. 2 is to be replicated N times in each LMS processor 20-m. Specifically, subband reference signal $y_m(t)$ is processed by shift register 30, a tap delay line having N taps, to produce a set $y_m$ of N values. The complex conjugate of each of these values is computed, as indicated by the asterisk (*) in the illustration, and a product of each of these resulting N values and subband residual error signal $e_m(t)$ is computed by multiplier 32. Finally, each of the N values which result from this multiplication is passed through amplifier 34 (having gain $\mu$) and integrated by adder 36 and delay 38, to produce a corresponding one of the N adaptive weights of set $w_m$. This process ensures that only that part of the subband residual error signal which is correlated with the subband reference signal will be removed by the adaptive filtering process of the system of FIG. 1. Therefore, if disturbance signal $d(t)$ includes a source signal which is not part of a disturbance, the technique of the present invention will advantageously only remove those portions of the signal which are, in fact, correlated with the disturbance.

Figure 3:
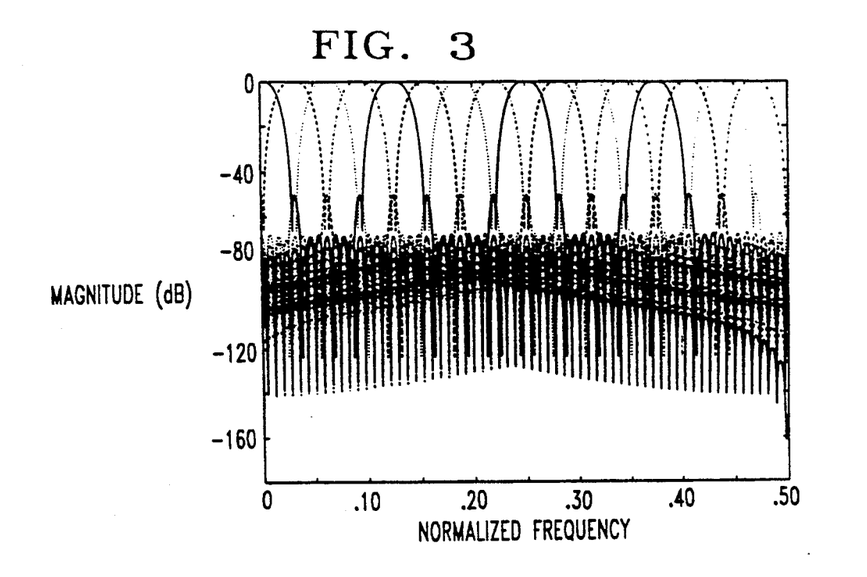
FIG. 3 shows the frequency response of subband filters in accordance with an illustrative example of the system of FIG. 1.

Illustratively, the low-delay subband adaptive filter of FIG. 1 assumes M=32 and N=32. A wideband filter of MN/2=512 taps may then be selected for programmable filter 12 and a 32-subband filter bank may be designed using a conventional polyphase FFT technique with twice-critical sampling (i.e., decimation by a factor of 16). Note that the subband filter back actually comprises 33 (M+1) subband filters, where the first and last filters reflect two halves of the same subband. FIG. 3 illustrates the frequency response of the first M/2+1=17 filters, which are the only ones processed due to the complex conjugate symmetry in accordance with this illustrative example. Each subband spans the 512 tap impulse response using N=32 taps. Each of the sets $w_m$ of subband adaptive weights are transformed by a corresponding 32-point FFT processor 22-m to obtain 32 frequencies per subband. These frequencies are then stacked in the manner illustrated in FIG. 4 to form points 0 to 255 of a 512 point spectrum. In particular, the frequencies from subband 0 are assigned first, followed by those from subband 1, and so forth. Note that only the middle half (16) of the N=32 frequencies are used for the odd numbered subbands, and only the upper and lower quarters of the 32 frequencies (i.e., the upper 8 and the lower 8) are used for the even numbered subbands. Moreover, these upper and lower quarters of the frequencies in the even subbands are transposed before assembly. The array is then completed by setting point 256 to zero and by using the complex conjugates of points 1 to 255 in reverse order to fill in points 257 to 511. Finally, the 512 point spectrum is then transformed by 512-point inverse FFT processor 24 to obtain the wideband filter weights w for programmable filter 12. Note that the above example is described for illustrative purposes only. The technique according to the present invention can accommodate an arbitrary number of taps, number of subbands, decimation factor, etc., all of which may be optimized for a particular application.

A special case of the system of FIG. 1 results when C=1, that is, when them is no cancellation path filter 26 (or cancellation path estimate filter 28). In this case, the system of FIG. 1 reduces to the low-delay subband LMS system illustrated in FIG. 5. This special case concerns the acoustic echo cancellation problem, where $x(t)$ is an electrical line input signal, $d(t)$ is a microphone signal, and summation 14 is an electronic subtraction circuit that derives the output signal $e(t)$. As with the case of FIG. 1, signal $\hat{d}(t)$ output from programmable filter 12 reflects an estimate of the disturbance signal $d(t)$.

Figure 5:
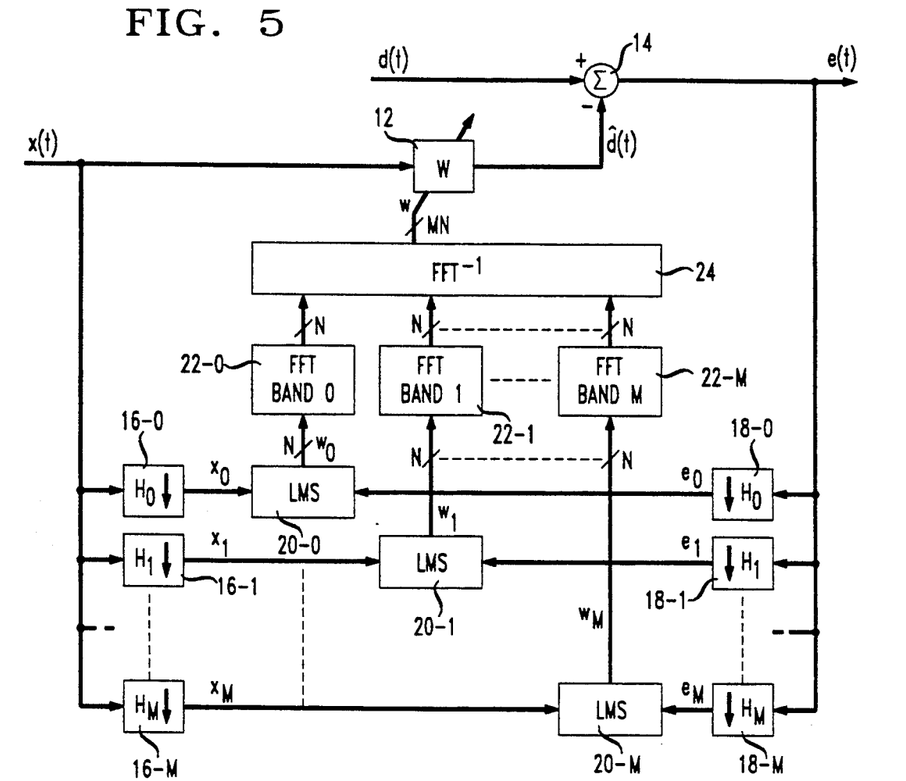
FIG. 5 shows the system of FIG. 1 without a cancellation path filter.

The low-delay subband systems of FIGS. 1 and 5 can be characterized as closed-loop systems since the output residual error signal is fed back to the subband residual error filter bank. An alternative embodiment is possible for the special case of the low-delay subband system of FIG. 5 (where there is no cancellation path transfer function). Such an alternative, second embodiment of the present invention may be characterized as an open-loop system, and is illustrated by the system shown in FIG. 6.

Figure 6:
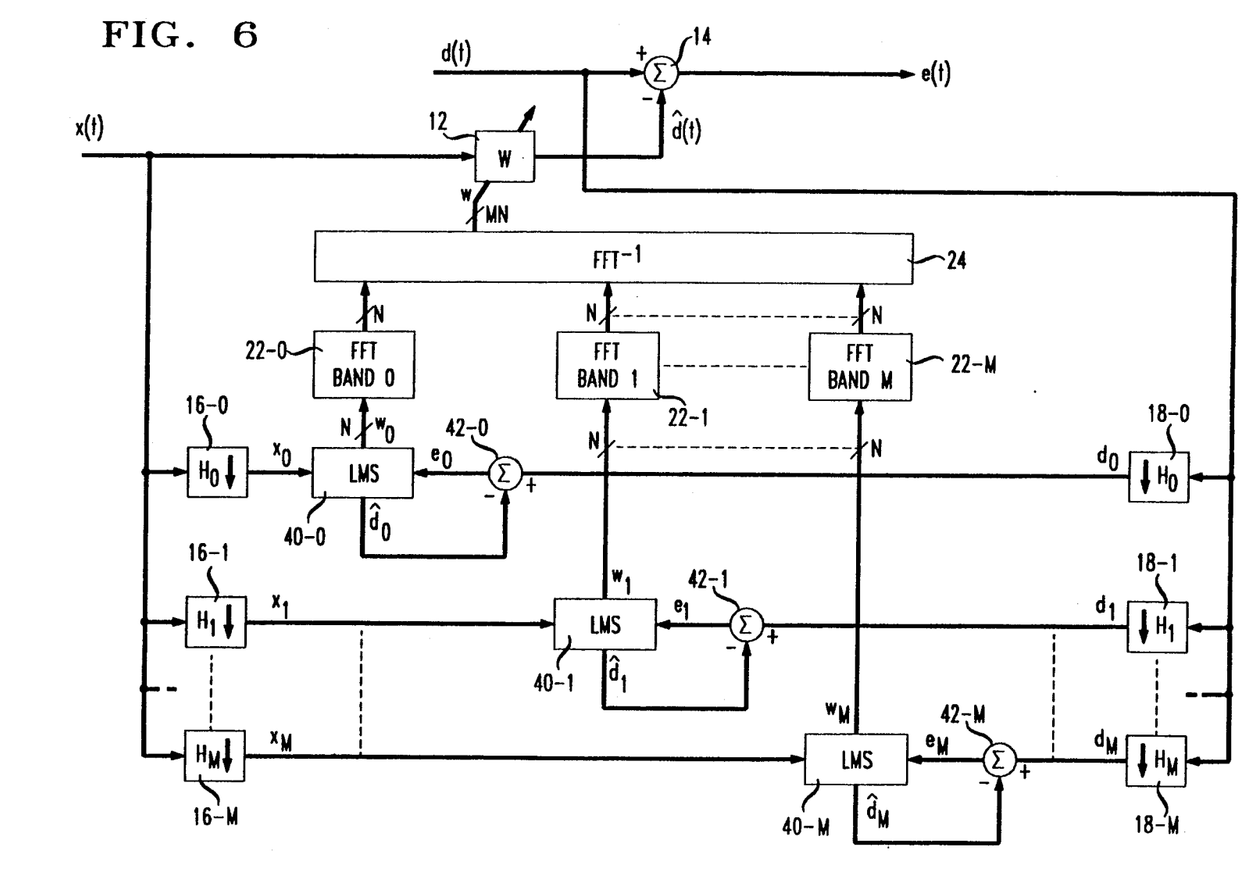
FIG. 6 shows a block diagram of a low-delay subband adaptive filter according to a second embodiment of the present invention.

Specifically, in the open-loop system of FIG. 6, LMS processors 20-0, 20-1, . . . and 20-M are replaced by alternate LMS processors 40-0, 40-1, . . . and 40-M (hereafter 40-m), respectively. In addition to generating a corresponding set $w_m$ of N adaptive weights, each of these substitute LMS processors also generates subband disturbance estimate signals $\hat{d}_0, \hat{d}_1, \ldots$ and $\hat{d}_M$ (hereafter $\hat{d}_m$), respectively, which are used to derive corresponding "local" subband residual error signals $e_0, e_1, \ldots$ and $e_M$ (hereafter $e_m$), respectively. Each of these local subband residual error signals is, in turn, supplied back to the corresponding LMS processor. Specifically, subband filters 18-m decompose disturbance signal d(t) which reflects a disturbance, into a plurality of subband signals $d_0, d_1, \ldots$ and $d_M$ (hereafter $d_m$). This is, of course, in contrast to the system of FIG. 5, in which subband filters 18-m decompose residual error signal e(t) (which also reflects a disturbance) into subband residual error signals $e_m$. Then, in the system of FIG. 6, each subband summation 42-0, 42-1, ... and 42-M (hereafter 42-m) computes the corresponding local subband residual error signal $e_m$ to be supplied to the corresponding LMS processor 40-m. Ultimately, programmable filter 12 generates disturbance estimate signal $\hat{d}(t)$, which reflects an estimate of the disturbance, based on the outputs of LMS processors 40-m. Since the (wideband) residual error signal e(t) is not fed back to the subband weight calculation, the system of FIG. 6 can be characterized as an open-loop version of the system of FIG. 5.

Figure 4:
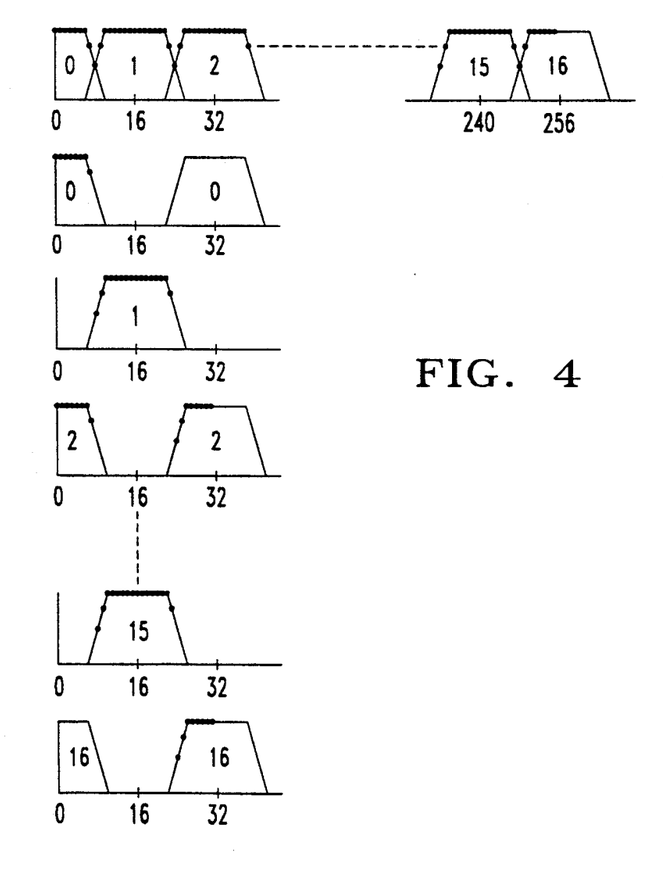
FIG. 4 shows the process of frequency stacking in accordance with the illustrative example of the system of FIG. 1.

FIG. 7 illustrates the detailed operation of each conventional LMS processor 40-m of the system shown in FIG. 4. The operation of LMS processor 40-m is nearly identical to that of LMS processor 20-m as illustrated in FIG. 2 and described above. The difference is that multiplier 44 has been added to LMS processor 40-m to generate subband disturbance estimate signal $\hat{d}_m(t)$ for the purpose as described above in connection with the operation of the system of FIG. 4.

The convergence of an open-loop system such as the one illustrated in FIG. 4 may be initially quicker than that of the closed-loop system of FIG. 3. However, after an initial convergence phase, the closed-loop system may continue to converge at a faster rate than the open-loop system. For this reason, it may be advantageous to provide a system incorporating both techniques. In such an embodiment of the present invention, the open-loop technique may be used initially, followed by a switch over to the closed-loop technique. For example, (electrical) switches may be provided at the inputs and the outputs of subband filters 18-m. The input switches may be designed to supply either disturbance signal d(t) or residual error signal e(t) to each subband filter. The output switches may be designed to supply the output of each subband filter either to a corresponding subband summation 42-m or directly to a corresponding LMS processor 40-m. In this manner, an embodiment having combined convergence characteristics may be obtained.

Figure 8:
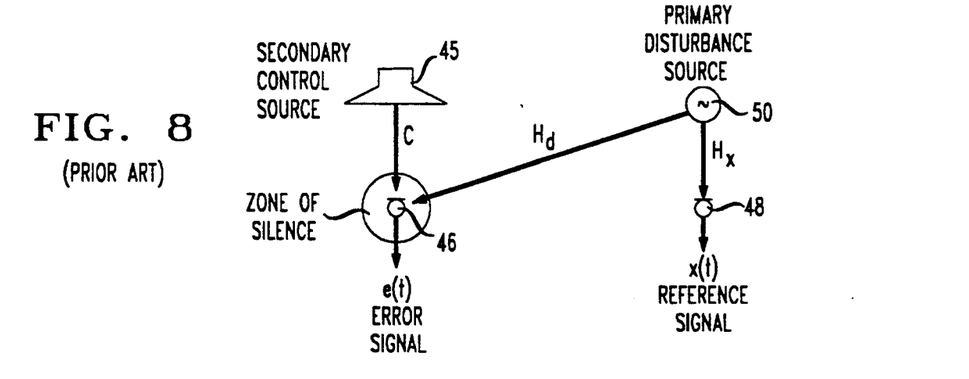
FIG. 8 illustrates the application of active noise control techniques to address an acoustic noise problem.

FIG. 8 illustrates the application of active noise control to address an acoustic noise problem. Primary disturbance source 50 generates acoustic noise in an enclosed room. Specifically, it is desired to create a "zone of silence" around microphone 46 by controlling loudspeaker 45 to produce a canceling acoustic signal. Microphone 46, therefore, obtains the residual error signal e(t) which is to be minimized. The reference signal x(t) is derived from microphone 48, which is in close proximity to primary disturbance source 50. Thus, reference signal x(t) may be reasonably assumed to be highly correlated with the disturbance which is to be eliminated from the intended zone of silence. The acoustic transfer functions $H_d$, $H_x$, and C are transfer functions over which no control exists, as they are inherent in the environment (i.e., resulting from the acoustics of the room). These transfer functions are described below in the discussion of FIG. 9.

Figure 9:
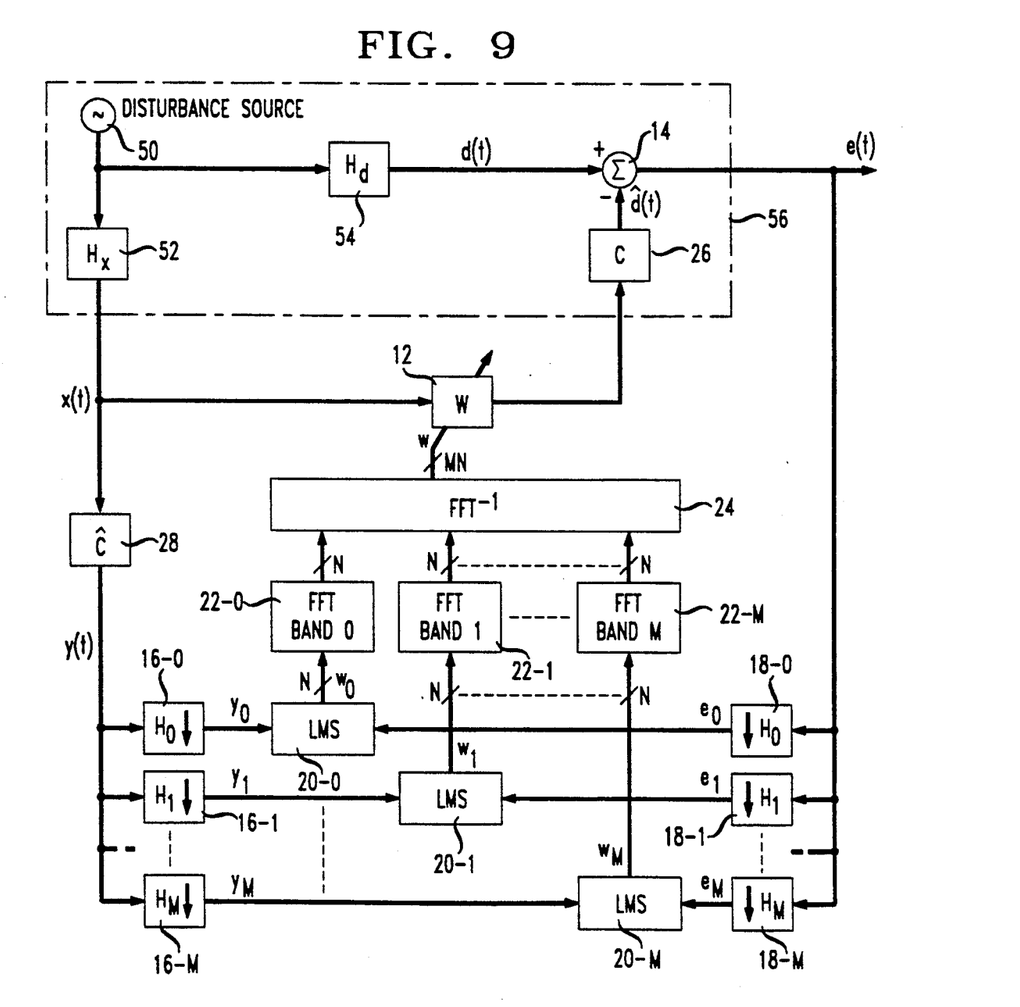
FIG. 9 shows the system of FIG. 1 as applied in the context of the technique of active noise control as illustrated in FIG. 8.

FIG. 9 shows the system of FIG. 1 as applied to the problem of active noise control as illustrated in FIG. 8. The components of the system contained in (dashed) box 56 represent that part of the environment over which no direct access or control is available, except for the reference signal and residual error "observation" ports x(t) and e(t), respectively, and the control input (the output of programmable filter 12) which is to be supplied in accordance with the technique of the present invention. Specifically, filter 52, having transfer function $H_x$, reflects the effect of the environment on disturbance source 50 as it is travels through the room and is captured by microphone 48 to generate reference signal x(t). Filter 54, having transfer function $H_d$, reflects the effect of the environment on disturbance source 50 as it travels through the room to the intended zone of silence surrounding microphone 46. Cancellation path filter 26, having transfer function C, reflects the effect of the environment (and of loudspeaker 45 itself) on the signal generated by programmable filter 12 for the purpose of cancelling disturbance source 50 (as filtered by filter 54). And summing circuit 14 reflects the inherent process of the acoustic combination of these acoustic signals which occurs at the intended zone of silence. Therefore, by minimizing residual error signal e(t) through the generation of filter weights w which control programmable filter 12, the zone of silence may be quieted. Note that programmable filter 12 advantageously has a sufficient number of taps to span the combined length of transfer functions $H_d$ and $(H_xC)^{-1}$.

Figure 10:
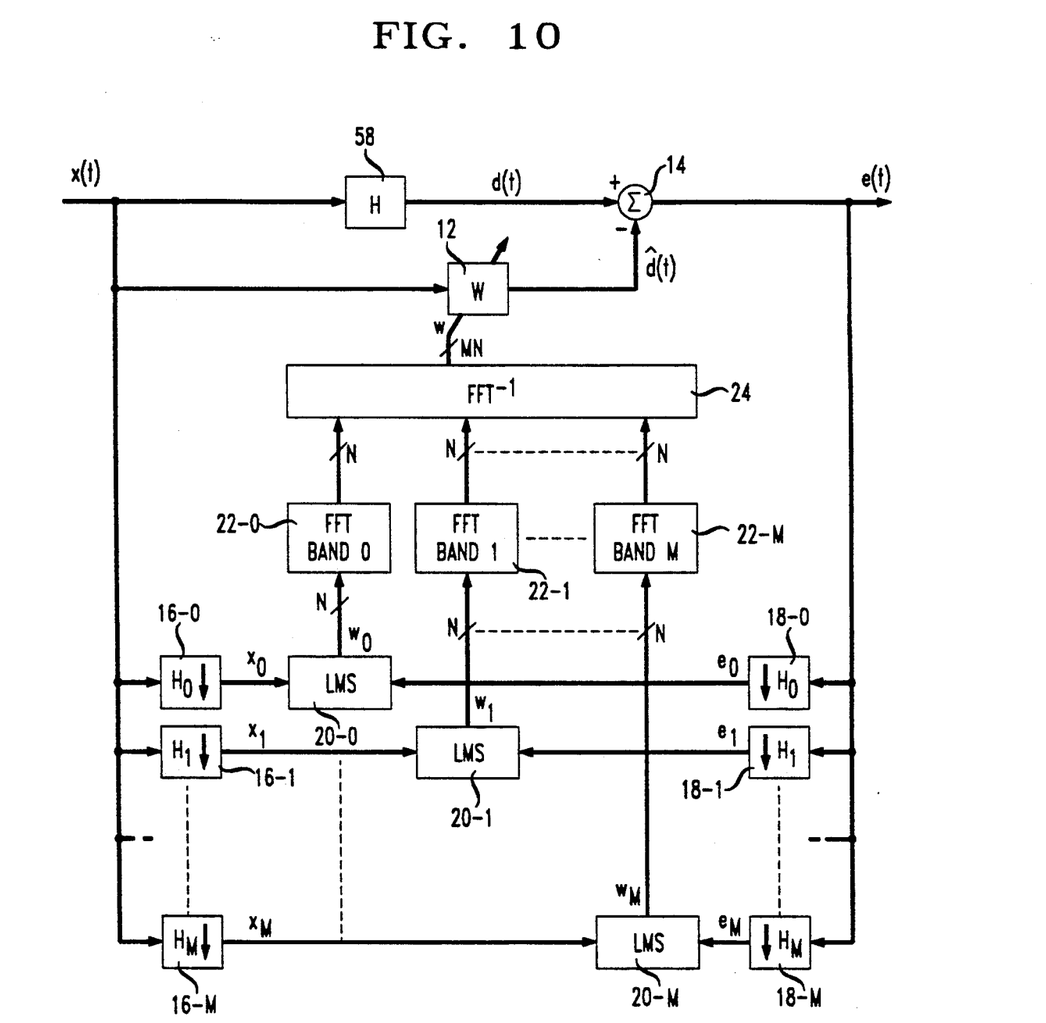
FIG. 10 shows the system of FIG. 1 as applied to the problem of acoustic echo cancellation.

FIG. 10 illustrates the system of FIG. 1 as applied to the problem of acoustic echo cancellation. In this case, reference signal x(t) may be interpreted as a "far-end" received signal, H may be interpreted as an acoustic echo path transfer function (effectuated by filter 58), and residual error signal e(t) may be interpreted as a de-echoed return signal (to which the desired "near-end" source signal may be added). Thus, by minimizing residual error signal e(t), the echo effect in the resultant combined signal (i.e., the source signal plus the residual error signal) will be appropriately reduced. Note that the open-loop embodiment of the system of FIG. 4 may also be used in an analogous manner to address the problem of acoustic echo cancellation.

For clarity of explanation, the illustrative embodiments of the present invention have been presented as comprising individual functional blocks (including functional blocks labeled as "processors"). The functions these blocks represent may be provided through the use of either shared or dedicated hardware, including, but not limited to, hardware capable of executing software. For example, the functions of processors presented in the figures may be provided by a single shared processor. (Use of the term "processor" should not be construed to refer exclusively to hardware capable of executing software.)

Illustrative embodiments may comprise digital signal processor (DSP) hardware, such as the AT&T DSP16 or DSP32C, read-only memory (ROM) for storing software performing the operations discussed below, and random access memory (RAM) for storing DSP results.

Very large scale integration (VLSI) hardware embodiments, as well as custom VLSI circuitry in combination with a general purpose DSP circuit, may also be provided.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention.

We claim:

1. A method for generating a signal reflecting an estimate of a disturbance, the method comprising the steps of
    filtering a signal reflecting reference information with a plurality of subband filters to produce a plurality of subband reference reflecting signals;
    filtering a signal reflecting a disturbance with a plurality of subband filters to produce a plurality of subband disturbance reflecting signals;
    generating a plurality of sets of time domain subband weighting signals based on said subband reference reflecting signals and said subband disturbance reflecting signals;
    combining said plurality of sets of time domain subband weighting signals to form a set of combined time domain weighting signals; and
    filtering said reference signal with use of said set of combined time domain weighting signals to produce the signal reflecting an estimate of a disturbance.

2. The method according to claim 1 wherein said signal reflecting reference information is correlated with said disturbance signal.

3. The method according to claim 1 wherein said generating step comprises use of a complex LMS process.

4. The method according to claim 1 wherein said step of combining said plurality of sets of time domain subband weighting signals comprises the steps of
    transforming said plurality of sets of time domain subband weighting signals to a plurality of sets of frequency domain subband weighting signals;
    combining said plurality of sets of frequency domain subband weighting signals to form a combined set of frequency domain weighting signals; and
    transforming said combined set of frequency domain weighting signals to a set of combined time domain weighting signals.

5. The method according to claim 4 wherein said step of transforming said plurality of sets of time domain subband weighting signals comprises use of a Fourier Transform process.

6. The method according to claim 5 wherein said step of transforming said combined set of frequency domain weighting signals comprises use of an inverse Fourier Transform process.

7. The method according to claim 1 wherein said signal reflecting reference information comprises a reference signal.

8. The method according to claim 1 wherein said signal reflecting reference information is generated by filtering a reference signal.

9. The method according to claim 1 wherein said signal reflecting a disturbance further reflects said signal reflecting an estimate of a disturbance.

10. An adaptive filter for generating a signal reflecting an estimate of a disturbance, the apparatus comprising
    a plurality of subband filters for generating a plurality of subband reference reflecting signals based on a signal reflecting reference information;
    a plurality of subband filters for generating a plurality of subband disturbance reflecting signals based on a signal reflecting a disturbance;
    means for generating a plurality of sets of time domain subband weighting signals based on said subband reference reflecting signals and said subband disturbance reflecting signals;
    means for combining said plurality of sets of time domain subband weighting signals to form a combined set of time domain weighting signals; and
    a programmable filter for filtering said reference signal with use of said set of combined time domain weighting signals to produce the signal reflecting an estimate of a disturbance.

11. The apparatus according to claim 10 wherein said signal reflecting reference information is correlated with said disturbance signal.

12. The apparatus according to claim 10 wherein said generating means comprises use of a complex LMS process.

13. The apparatus according to claim 10 wherein said means for combining said plurality of sets of time domain subband weighting signals comprises
    means for transforming said plurality of sets of time domain subband weighting signals to a plurality of sets of frequency domain subband weighting signals;
    means for combining said plurality of sets of frequency domain subband weighting signals to form a combined set of frequency domain weighting signals; and
    means for transforming said combined set of frequency domain weighting signals to a set of combined time domain weighting signals.

14. The apparatus according to claim 13 wherein said means for transforming said plurality of sets of time domain subband weighting signals comprises means for performing a Fourier Transform.

15. The apparatus according to claim 14 wherein said means for transforming said combined set of frequency domain weighting signals comprises means for performing an inverse Fourier Transform.

16. The apparatus according to claim 10 wherein said signal reflecting reference information comprises a reference signal.

17. The apparatus according to claim 10 further comprising a filter for generating said signal reflecting reference information based on a reference signal.

18. The apparatus according to claim 10 wherein said signal reflecting a disturbance further reflects said signal reflecting an estimate of a disturbance.

* * * * *